United States Patent
Maertens

(10) Patent No.: US 11,130,151 B2
(45) Date of Patent: Sep. 28, 2021

(54) SYSTEM AND METHOD FOR COATING A BODY

(71) Applicant: Philip Maertens, Torhout (BE)

(72) Inventor: Philip Maertens, Torhout (BE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 262 days.

(21) Appl. No.: 16/164,983

(22) Filed: Oct. 19, 2018

(65) Prior Publication Data

US 2019/0126315 A1    May 2, 2019

(30) Foreign Application Priority Data

Oct. 26, 2017   (EP) .................................. 17198428

(51) Int. Cl.
| | |
|---|---|
| *B05D 1/18* | (2006.01) |
| *G06F 30/20* | (2020.01) |
| *B05C 3/10* | (2006.01) |
| *B05C 11/11* | (2006.01) |
| *G05B 19/4093* | (2006.01) |

(52) U.S. Cl.
CPC .................. *B05D 1/18* (2013.01); *B05C 3/10* (2013.01); *B05C 11/11* (2013.01); *G05B 19/40937* (2013.01); *G06F 30/20* (2020.01); *G05B 2219/49056* (2013.01)

(58) Field of Classification Search
None
See application file for complete search history.

(56) References Cited

U.S. PATENT DOCUMENTS

| | | | | |
|---|---|---|---|---|
| 8,219,370 B1 * | 7/2012 | DiVerdi | ................... | G06F 30/20 |
| | | | | 703/9 |
| 2007/0010977 A1 | 1/2007 | Shen | | |

FOREIGN PATENT DOCUMENTS

| | | |
|---|---|---|
| CN | 105344558 A | 2/2016 |
| CN | 105413965 A | 3/2016 |
| CN | 105521910 A | 4/2016 |
| CN | 106733498 A | 5/2017 |
| DE | 10217022 A1 | 11/2003 |

(Continued)

OTHER PUBLICATIONS

Hess Frederick et al: "Automotive E-Coat Paint Process Simulation Using FEA", NAFEMS Ninth International Conference, pp. 1-18, XP055463381, Orlando, FL, USA, 2003.

(Continued)

*Primary Examiner* — Shamim Ahmed
*Assistant Examiner* — Bradford M Gates
(74) *Attorney, Agent, or Firm* — Lempia Summerfield Katz LLC

(57) ABSTRACT

At least a part of at least one body is coated. At least one processor determines a respective resulting coating layer based on simulating moving the respective body at least partially through a coating fluid of a dipping bath along different trajectories. The at least one processor determines a first trajectory out of the different simulated trajectories fulfilling one or more pre-defined conditions and causes at least one drive component for moving the respective body to move the respective body at least partially through the coating fluid of the dipping bath along the first trajectory.

11 Claims, 3 Drawing Sheets

(56) References Cited

FOREIGN PATENT DOCUMENTS

JP     2009052127 A    3/2009
WO     2009028388 A1   3/2009

OTHER PUBLICATIONS

Zhang, Xian-Ming, et al. "Numerical simulation and experimental validation of liquid-film-flow characteristics in dip coating for non-Newtonian fluids." Polymer Engineering & Science 56.9 (2016): 1070-1078.
European Search Report for corresponding Application No. 17198428.9—1224 dated Apr. 10, 2018.
Chinese Office Action cited in corresponding Chinese patent application No. 2018110667344; dated Jan. 29, 2021; 18 pp.
Chinese Office Action for Chinese Application No. 201811066734.4 dated Jul. 14, 2021, with English translation.

* cited by examiner

SYSTEM AND METHOD FOR COATING A BODY

RELATED CASE

This application claims the benefit of EP 17198428.9, filed on Oct. 26, 2017, which is hereby incorporated by reference in its entirety.

BACKGROUND

The present disclosure is directed, in general, to computer-aided design (CAD), computer-aided manufacturing (CAM), computer-aided engineering (CAE), visualization, simulation, and manufacturing systems, product data management (PDM) systems, product lifecycle management (PLM) systems, manufacturing operations systems (MOM) and similar systems that are used to create, use, and manage data for products and other items (collectively referred to herein as product systems).

Product systems may be used to facilitate manufacturing products. Such systems may benefit from improvements.

SUMMARY AND DETAILED DESCRIPTION

The present embodiments relate to a system and a method for coating at least a part of at least one body.

Variously disclosed embodiments include data processing systems and methods that may be used to facilitate coating at least a part of at least one body.

In one example, a method for coating at least a part of at least one body may include, through operation of at least one processor: determining a respective resulting coating layer based on simulating moving the respective body at least partially through a coating fluid of a dipping bath along different trajectories; determining a first trajectory out of the different simulated trajectories fulfilling one or more pre-defined conditions; and causing at least one drive component for moving the respective body to move the respective body at least partially through the coating fluid of the dipping bath along the first trajectory.

In another example, a system may include at least one processor configured via executable instructions included in at least one memory to determine a respective resulting coating layer based on simulating moving the respective body at least partially through a coating fluid of a dipping bath along different trajectories; determine a first trajectory out of the different simulated trajectories fulfilling one or more pre-defined conditions; and cause at least one drive component for moving the respective body to move the respective body at least partially through the coating fluid of the dipping bath along the first trajectory.

A further example may include a non-transitory computer readable medium encoded with executable instructions (such as a software component on a storage device) that when executed, causes at least one processor to carry out this described method.

Before describing the suggested convention in more detail, it should be understood that various definitions for certain words and phrases are provided throughout this patent document, and those of ordinary skill in the art will understand that such definitions apply in many, if not most, instances to prior as well as future uses of such defined words and phrases. While some terms may include a wide variety of embodiments, the appended claims may expressly limit these terms to specific embodiments. It should also be appreciated that features explained in the context of the suggested method may also be comprised by the suggested system by appropriately configuring and adapting the system and vice versa.

The suggested method and system may render the production of respective bodies quicker, qualitatively better and more flexible. This may be achieved by linking and directly applying the results of sophisticated simulations to the manufacture of such bodies. The respective body may be a complex structure including openings, recesses, passages and the like.

By way of example, the system may further include the dipping bath including the coating fluid and the at least one drive component for moving the respective body.

Without loss of generality and simply for illustration, the suggested method and system are now discussed in the frame of an exemplary application. For the e-paint process of a car manufacture, the car body is dipped into a paint bath. Consequently, the body is embodied as the car body, the dipping bath is embodied as a paint bath and the coating fluid is embodied as the paint. The movement of the car body into the paint, through and out of the paint bath is controlled by automation controllers (e.g., programmable logic controller (PLC)), drives and electric motors that may be the drive component. In addition, the system may include switch gears and electrolysis inverters.

The movements of the car body are needed to let bubbles out and allow the paint to touch all relevant areas of the sheet metal of the car that need to be painted. The speed may need to be limited so that no or no substantial mechanical deformations of the geometry of the respective body occur. The main challenges are the achievement of a high paint quality and a short process time. In addition, flexibility is needed to adapt the dipping process to the different car types.

According to a different approach, customers contact different suppliers offering different solutions. No coupling between the digital simulation part and the automation installation has been realized. This means that in this approach no integrated solution may be proposed by any supplier.

Contrary to this approach, the suggested method and system include the act of simulating the respective body being at least partially moved through the coating fluid of the dipping bath along different trajectories and determining the resulting coating layer. This act aims for establishing a relationship between a respective trajectory and the respective body on one hand and the respective resulting coating layer or coating distribution on the other hand. Consequently, for a given body, several or numerous trajectories may be simulated to obtain information about the respective resulting coating layer that may include information about the thickness of the coating at different locations of the respective body and the presence or absence of gaps of the coating layer, e.g. due to bubbles of the coating fluid.

It is worth noting that the act of determining a resulting coating layer and determining the first trajectory may also be applied to a sequence of a first body and a second body and optionally further bodies that are at least partially moved through the coating liquid of the dipping bath, whereby interactions and correlations between the movement of the first body and the movement of the second body and optionally further bodies may be taken into account. This means that the act of determining a respective resulting coating layer and determining the respective first trajectory is not limited to a single body being moved through the coating liquid of a dipping bath that is static and not subject to disturbances and flows of the coating liquid due to other bodies being moved through the bath. Rather, more complex interaction processes may also be taken into account that occur when the first body is moved through the coating liquid and the second body is following the first body through the dipping bath when the coating liquid at the position of the second body is still influenced by the movement of the first body.

These more complex interaction processes are particularly interesting if the first body is of a different type than the second body or the optional further bodies. This may for example be the case when the first body is a convertible car body and the second body is a station wagon car body. Consequently, according sequence information concerning the described sequence of bodies may be taken into account.

Furthermore, the suggested method and system include the act of determining a first trajectory. To this end the simulated trajectories may be compared using one or more predefined conditions, e.g. with respect to the resulting coating layer.

Additionally, the suggested method and system include the act of causing at least one drive component for moving the respective body to move the respective body at least partially through the coating fluid of the dipping bath along the first trajectory. The term causing may be understood, for example, such that the determined first trajectory is stored and made available for action to the respective drive component. To this end, the respective drive component may, for example, be informed that the first trajectory is available for retrieval. As will be explained below, this may be realized when the acts of determining a respective resulting coating layer and determining a first trajectory are carried out by a first device, such as a computer, and the act of causing is carried out by a second device, such as a PLC, whereby the first device and the second device are coupled for data transmission. In another approach, the term causing may be understood such that the determined first trajectory is directly put in action by the respective drive component through commands by the at least one processor that has also carried out the acts of determining a resulting coating layer and determining a first trajectory.

The respective drive component may include, by way of example, an automation controller (e.g., PLC) and optionally furthermore a drive and an electric motor. Furthermore, a structure, such as a skid, for supporting the respective body may be the respective drive component. The electric motor may be driven by the drive, be controlled by the automation controller, and be connected to the supporting structure. Alternatively, the electric motor and the drive may be replaced with a hydraulic actuator and an appropriate supply system. A combination of an electric motor with a hydraulic actuator may also be possible. In certain embodiments, one automation controller and/or one drive may also be used to control or drive two or more electric motors moving one or more bodies, respectively. Thus, the respective drive component is equipped and configured to move the respective body along a given trajectory. According to the suggested method and system, the determined first trajectory of the respective body may then be realized by the at least one drive component.

By way of example, the acts of determining a respective resulting coating layer and determining the first trajectory may be carried out beforehand for different, typical manufacturing scenarios, such as typical kinds of respective bodies. The respective determined first trajectory may then be stored in the at least one memory. Later, when the respective manufacturing scenario occurs, the determined corresponding first trajectory may be loaded by the at least one processor from the at least one memory, and the at least one processor causes the respective drive component to move the respective body along the first trajectory corresponding to the respective manufacturing scenario.

In the example of e-painting car bodies, the e-paint simulation may be used to iteratively find an optimal motion path through the paint bath. Of course, the following aspects of the embodiments are not limited to the e-painting of car bodies but may be applied to other coating process of other bodies, too. The output of the simulations/optimization software should be the motion curve, xyz axis, rotations along the axis etc. and the accelerations and decelerations and the speed along the path. This may be done by controlling the simulations with a technology like STAR-CCM+ from Siemens Industry Software Computational Dynamics Limited (London, UK) and HEEDS from Siemens Product Lifecycle Management Software Inc. (Plano, Tex., USA) to calculate the optimal dipping scenario.

By way of example, the simulation and the control of the respective drive component may be carried out by the same device, such as the same processor. This one device may be an automation controller, such as a PLC, that also permits other software to run on the controller, here the simulation and determination of the first trajectory.

In another approach, the simulation and determination of the first trajectory may be carried out on a first device, such as a computer or a cluster of computers or processors. The control of the respective drive component is carried out by a second device, such as an automation controller like the PLC Simatic S7-1500 of Siemens Aktiengesellschaft or a cluster of automation controllers. For the above-mentioned dipping scenario, the path including all parameters may be imported into the controller for the drives and actuators that move the skid supporting the car body to control the complete process. This implies that data from the simulation and determination acts may be transmitted to the second device, which then transforms this data into control set points for the drive component or drive system. Different car types may produce different optimal dipping scenarios. Considering the real status parameters of the process that are present in the automation controller and/or from a sensor as well the simulation results with the actual parameters may be used to change or adapt the parameters while dipping.

When the simulation and determination acts are done by a first device, such as a computer, and the control of the respective drive component is carried out by a second device, such as a PLC, it is particularly advantageous to link the two mentioned devices together through a communication system, such as point-to-point, a bus system, Ethernet, etc. The communication system may, for example, be wireless or wired.

Among the advantages of the suggested method and system is that a customer, such as a line builder equipping a manufacturing facility for manufacturing car bodies, may obtain all automation and simulation products out of one hand. The suggested integrated solution has a lot of benefits compared to a competitive solution where the customer would have three different suppliers instead of one (e.g., the responsibility for the complete installation is in one hand). Furthermore, the technical stability may more easily be guaranteed between the different products, which are configured to cooperate and communicate seamlessly and compatibly. This may ensure an error-free connection of simulation results and car in process identity. Optimizing scenarios combined with automation will lead to better paint quality, consume less paint, and reduce costs, to a faster dipping process, which increases the through put and the revenues.

The suggested method and system may impact on the business such that a line builder equipping a manufacturing facility for manufacturing car bodies may act as one sole supplier for the complete integrated solution. This may create a competitive advantage since this line builder is able to offer both simulation and controls.

The coating fluid may include at least a paint, automotive paint, an enamel paint, a primer or undercoat, a basecoat, a clearcoat, a copper sulfate liquid, or any combination thereof.

It should also be appreciated that, by way of example, the one or more pre-defined conditions include at least one of minimum requirements of the resulting coating layer, a maximum deformation of the respective body, a maximum time duration, or any combination thereof.

The pre-defined conditions may be understood as criteria and boundary conditions for selecting a favorable trajectory among the simulated trajectories. According to one potential condition, the coating achieved by using a given trajectory must fulfill certain minimum requirements, including, for example, a given target range of a thickness of the coating and, preferably, absence of gaps of the coating layer exceeding a certain size that may occur due to bubbles of the coating fluid. for example, the target range of a thickness of the coating may be 90 to 110 mm or 80 to 220 mm and the upper limit of gap sizes may be 50 µm or 200 µm.

According to another potential condition, the trajectory must not result in a non-negligible, considerable and unwanted deformation of the geometry of the respective body so that only trajectories causing negligible deformations may be accepted. A non-negligible deformation may, by way of example, be any deviation from an ideal body geometry larger than 200 µm or larger than 50 µm. This means that the maximum deformation may be understood as a threshold of 200 µm or 50 µm. Depending on the type of the body and the required precision this threshold may be smaller or larger.

According to yet another potential condition, the trajectory along which the body is moved through the coating fluid of the dipping bath must only take up to a maximum time duration. This parameter strongly depends on the considered body and the particular coating process. By way of example, the maximum time duration may be understood as another threshold. It may be determined, for example, by using experience of comparable processes and bodies so that at least a plausibility check may be performed.

By way of example, a certain prioritization may be applied so that, for example, the minimum requirements of the resulting coating layer must be fulfilled for the selection of a simulated trajectory as the first trajectory. Then, if several trajectories fulfill this condition, some of these trajectories may still be dismissed if the maximum deformation is exceeded. If at least two trajectories fulfill these two conditions, one can apply that trajectories may only be determined as the first trajectory if they do not exceed a maximum time duration. By way of example, if several different trajectories fulfill one or more of the mentioned requirements, the one that has the shortest time duration for the coating may be chosen as the first trajectory.

In example embodiments, the method may further include through operation of the at least one processor determining the respective coating layer using the following input parameters: characteristics of the respective body, characteristics of the coating fluid, and characteristics of the dipping bath.

Using these input parameters, the simulation is enabled to give meaningful output with respect to the resulting coating, in particular coating distribution and coating thickness, optionally the time duration required for the coating, and optionally a potentially resulting deformation of the geometry of the respective body.

To refine the results of the simulation, additional input parameters may be included, such as, certain restraints of the respective drive component. Such restraints of the respective drive components may involve, for example, maxima of the trajectory with respect to velocity, acceleration, tilting angle, tilt angular velocity and/or tilt angular acceleration.

Furthermore, depending on the specific application case, further input parameters may be taken into account.

In further examples, the characteristics of the respective body may include at least one of geometry, dimensions, material, stiffness, surface structure, temperature, electric potential, electric conductivity, or any combination thereof.

The characteristics of the respective body influence the process of coating the body and are thus taken into account for the simulation of the coating. Depending on the specific application, some of the mentioned characteristics may play an important role or may be neglected. For example, for an e-painting process or for electroplating, electric properties like electric potential and electric conductivity of the respective body may be crucial for the process, whereas for regular painting without electric voltage being applied, these parameters may be neglected. For simulating a potentially resulting deformation of the body, the geometry, the dimensions, the material, the stiffness and the surface structure may be important parameters that should be used as input parameters. Furthermore, for simulating the resulting coating layer or coating distribution, the geometry, the material, the surface structure (e.g. the plainness of the surface), and the temperature may constitute relevant parameters. In addition, the position and a description of any calibration metal bars may be used to characterize the respective body.

By way of example, the characteristics of the coating fluid may include at least one of material, density, temperature, viscosity, surface tension, electric potential, electric conductivity, or any combination thereof.

Also, the characteristics of the coating fluid influence the process of coating the body and are thus taken into account for the simulation of the coating. Depending on the specific application, some of the mentioned characteristics may play an important role or may be neglected. For example, for an e-painting process or for electroplating, electric properties like electric potential and electric conductivity of the coating fluid may be crucial for the process, whereas for regular painting without electric voltage being applied, these parameters may be neglected. In particular, for simulating a potentially resulting deformation of the respective body, the density, the viscosity and the surface tension may be important parameters. Furthermore, for simulating the resulting coating layer or coating distribution, the material, the density, the temperature viscosity and the surface tension may constitute relevant parameters.

Further physical or chemical characteristics of the coating liquid and/or of the coating layer may be taken into account with respect to the characteristics of the coating fluid, such as the paint layer density or the coating layer density. For the example of e-painting or electroplating, an electro-deposition coating model may be used that also considers the paint Coulomb efficiency in $kg/(s*A)$ and/or the wet paint electrical resistivity in $\Omega*m$.

It should also be appreciated that, by way of example, the characteristics of the dipping bath may include at least one of geometry, dimensions, filling height of the coating fluid, information related to generated volumetric flow rate of the coating fluid, information related to heating or cooling, electric potential, electric power, or any combination thereof.

The characteristics of the dipping bath may constitute relevant boundary conditions, such as the geometry, the dimensions of the bath, and the filling height of the coating fluid. For some specific applications, additional features of the dipping bath may play a relevant role, such as a generated volumetric flow rate of the coating fluid, whereby its spatial distribution within the bath may be of interest. Another example would be specific heating or cooling elements included in the dipping by and which cool or heat the coating fluid, whereby the heating or cooling power and its spatial localization may be of interest. Yet another example relates to e-painting or electroplating, the spatial localization of the applied potential or voltage may be relevant as well as a geometric description of anode, particularly the frontal area exposed to the respective body, such as the car body. Furthermore, characteristics of the dipping bath may take into account changes of the mentioned parameters with elapsing time.

In further example embodiments, at least some of the characteristics of the respective body, the coating fluid and/or the dipping bath are provided to the at least one processor using at least one of a product lifecycle management (PLM) system, an engineering system, a manufacturing operation management (MOM) system, at least one sensor for sensing at least some of the characteristics, or any combination thereof. In these example embodiments, the system may further include at least one of a PLM system, an engineering system, a MOM system, at the at least one sensor, or any combination thereof, whereby the at least one sensor is configured to send at least some of the characteristics of the respective body, the coating fluid, and/or the dipping bath.

For example, at least some of the characteristics of the respective body may be provided to the at least one processor by a connected PLM system that includes information related to the respective body's geometry, dimensions, material, and/or surface structure. The PLM system may provide this information, such as in form of CAD data and/or a digital twin of the respective body. At least some of the characteristics of the coating liquid may be provided by a connected PLM system or a connected MOM system that may include information related to the coating liquid's material, density, viscosity and/or surface tension. The MOM system may provide at least some of the characteristics of the coating liquid, such as temperature and/or electric potential, or at least some of the characteristics of the dipping bath that are described above.

Furthermore, the at least one sensor may provide at least one of the characteristics of the respective body, such as the surface structure, temperature, electric potential, characteristics of the coating fluid (e.g., temperature, viscosity, electric potential), characteristics of the dipping bath (e.g., electric potential), or any combination thereof. The at least one sensor may be connected to the at least one processor for transmission of information.

Additional information may be provided to the at least one processor including sequence information about a sequence of bodies to be moved at least partially through the coating liquid of the dipping bath. This sequence information may be provided to the at least one processor by a MOM system and may include information about a first body and a subsequent second body and optionally about further bodies. This sequence information consequently allows for taking into account the above-described more complex interaction processes.

In further examples, the method may further include, through operation of the at least one processor, performing at least the acts of determining a respective resulting coating layer, determining the first trajectory and causing the at least one drive component to move the respective body on-line and/or in real-time.

Carrying out the mentioned acts on-line or in realtime renders the manufacturing process of the respective body very flexible and at the same time ensures optimal results with respect to the achieved coating layer, optionally the required time duration and optionally the involved negligible deformations of the respective body during the coating. To this end, corresponding acts of determining a resulting coating layer and determining the first trajectory are carried out in parallel to or immediately before causing the respective drive component to move the respective body according to the determined first trajectory. This realization of the suggested method and system is particularly interesting for the above-described sequence of bodies or when some of the boundary conditions of the coating process are subject to change, such as change in the condition of the coating liquid.

For the sequence of bodies and for changing types of bodies, other approaches involve stopping the coating process and testing different trajectories with the complete hardware including the dipping bath, the respective bodies, and the respective drive components. Of course, this is disadvantageous since the production is interrupted and waste bodies with insufficient coating may be produced. In addition, only a work trajectory may be found that consumes too much time compared to a more optimized trajectory. Contrary to this approach, the suggested embodiment of the method and the system avoid these disadvantages by carrying out the mentioned acts on-line or in real-time. Consequently, the on-line and/or real-time handling of the mentioned acts may be used to update the first trajectory when conditions (e.g. of the respective body) of the coating fluid or of the dipping bath, change.

By way of example, the respective trajectory may include at least one of position, velocity, acceleration, tilt angle, tilt angular velocity, tilt angular acceleration, or any combination thereof.

The respective trajectory may include the mentioned parameters at least for the time duration of the coating (i.e. when the respective body is in contact with the coating fluid of the dipping bath). Here, the tilt angle, the tilt angular velocity, and the tilt angular acceleration may refer to any spatial angle (e.g., in x-, y- or z-direction or any combination thereof). This implies that the respective body may, for example, be rotated along the direction of the velocity or in any direction that is perpendicular to the direction of the velocity. In principle, additional parameters may be taken into account, such as the jerk, being the rate of change of acceleration, or the tilt angular jerk.

It should also be appreciated that, by way of example, the method may further include through operation of the at least one processor determining control instructions to control the respective drive component such that the drive component moves the respective body at least partially through the coating fluid of the dipping bath along the first trajectory.

This implies that the determined first trajectory and the further parameters of the present dipping scenario are in a sense translated into control instructions for the respective drive component. By carrying out the control instructions, the respective drive component applies appropriate forces and/or torques on the respective body so that the respective body moves along the first trajectory. The mentioned further parameters may, by way of example, include the geometry and the dimensions of the respective body and the density and the viscosity of the coating fluid since a change of these parameters may require larger or smaller forces and/or torques for one and the same first trajectory.

The determined control instructions may then be sent or applied to the respective drive component to carry out corresponding actions to ensure that the respective body moves along the first trajectory.

In yet further example embodiments, the method may further include through operation of the at least one processor performing at least the acts of determining the respective resulting coating layer, determining the first trajectory and causing the at least one drive component to move the respective body such that at a first body and a directly following second body are seamlessly moved through the coating fluid of the dipping bath along their respective first trajectory.

This is an example of the above-mentioned, more complex interaction processes. Consequently, this aspect of the embodiment may also be applied to a sequence of a first body and a second body and optionally further bodies for which the mentioned steps are carried out, respectively. Here, the term "seamlessly" shall mean that the second body follows the first body without undue delay or waiting time so that a continuous and fluent manufacture and movement of the sequence of bodies through the coating fluid of the dipping bath may be ensured. A waiting time being larger than, for example, 150% of a minimal waiting time may be considered an undue delay.

The seamless movement of the two bodies may, by way of example, be achieved by carrying out the acts of determining a respective resulting coating layer and determining the first trajectory for different, typical manufacturing scenarios, such as typical kinds of respective bodies. The respective determined first trajectory may then be stored in the at least one memory. Later, when the respective manufacturing scenario, such as a given sequence of bodies, occurs, the determined corresponding first trajectory may be loaded by the at least one processor from the at least one memory and the at least one processor causes the respective drive component to move the respective body accordingly along the first trajectory corresponding to the respective manufacturing scenario.

Another way to ensure a seamless movement of the two bodies may, for example, be achieved by performing at least the acts of determining a respective resulting coating layer and determining the first trajectory and causing the at least one drive component to move the respective body on-line and/or in real-time.

The mentioned seamless movement is in particular of interest if the sequence of bodies includes bodies of different types.

By way of example, the respective body may include at least a part of at least one of a car body, an aircraft body, a marine vessel, a construction structure, an electrical cabinet, an electric or combustion motor, a production machine, or any combination thereof.

It should also be appreciated that, by way of example, the system may be configured to coat at least one of electrical cabinets, cubicles for mounting drives or control products, electric motors or parts thereof, parts of production machines, sheet metal via electroplating, ceramics, isolation materials, or any combination thereof.

Another example may include a product or apparatus including at least one hardware, software, and/or firmware-based processor, computer, component, controller, module, and/or unit configured for carrying out functionality corresponding to this described method.

The foregoing has outlined rather broadly the technical features of the present disclosure so that those skilled in the art may better understand the further detailed description that follows. Additional features and advantages of the disclosure will be described hereinafter that form the subject of the claims. Those skilled in the art will appreciate that they may readily use the conception and the specific embodiments disclosed as a basis for modifying or designing other structures for carrying out the same purposes of the present disclosure. Those skilled in the art will also realize that such equivalent constructions do not depart from the spirit and scope of the disclosure in its broadest form.

BRIEF DESCRIPTION OF THE DRAWINGS

Below, the embodiments are described using the figures.

DETAILED DESCRIPTION

Figure 1:
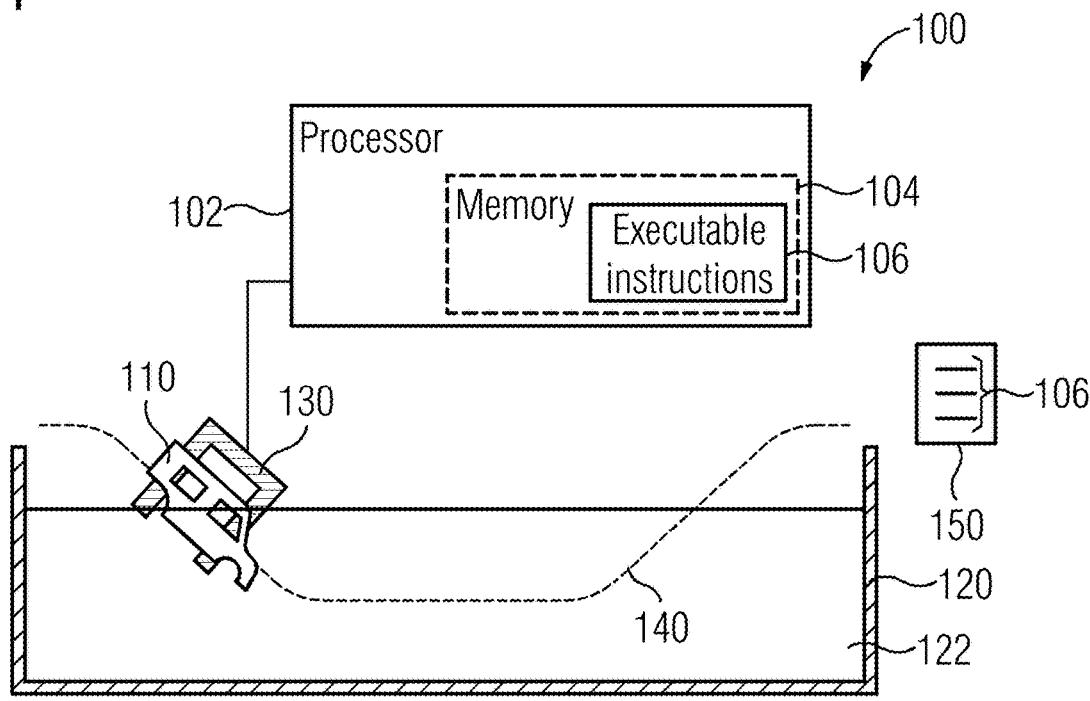
FIG. 1 illustrates a first exemplary system that facilitates coating a body.

Various technologies that pertain to systems and methods for coating at least a part of at least one body will now be described with reference to the drawings, where like reference numerals represent like elements throughout. The drawings discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged apparatus. It is to be understood that functionality that is described as carried out by certain system elements may be performed by multiple elements. Similarly, for instance, an element may be configured to perform functionality that is described as carried out by multiple elements. The numerous innovative teachings of the present application will be described with reference to exemplary non-limiting embodiments.

With reference to FIG. 1, a first exemplary system 100 is illustrated that facilitates coating a body 110. The system 100 includes a dipping bath 120 with a coating fluid 122, a drive component 130 for supporting and moving the body 110, and a processor 102 configured via executable instructions 106 included in a memory 104. The processor 102 is configured to determine a resulting coating layer based on simulating moving the respective body 110 at least partially through the coating fluid 122 of the dipping bath 120 along different trajectories; determine a first trajectory 140 out of the different simulated trajectories fulfilling one or more pre-defined conditions; and cause the at least one drive component 130 for moving the respective body 110 to move the respective body 110 at least partially through the coating fluid 112 of the dipping bath 120 along the first trajectory 140.

By way of example, the processor 102 may further be configured to perform at least the acts of determining a resulting coating layer, determining the first trajectory 140 and causing the at least one drive component 130 to move the respective body 110 such that at a first body 110 and a directly following second body 110' are seamlessly moved through the coating fluid 122 of the dipping bath 120 along their respective first trajectory 140, 140'.

It should be appreciated that the simulation may be carried out on a first device, such as a computer or a cluster of computers or processors, whereas the control of the respective drive component is carried out by second device, such as an automation controller like the PLC Simatic S7-1500 of Siemens Aktiengesellschaft or a cluster of automation controllers.

Figure 2:
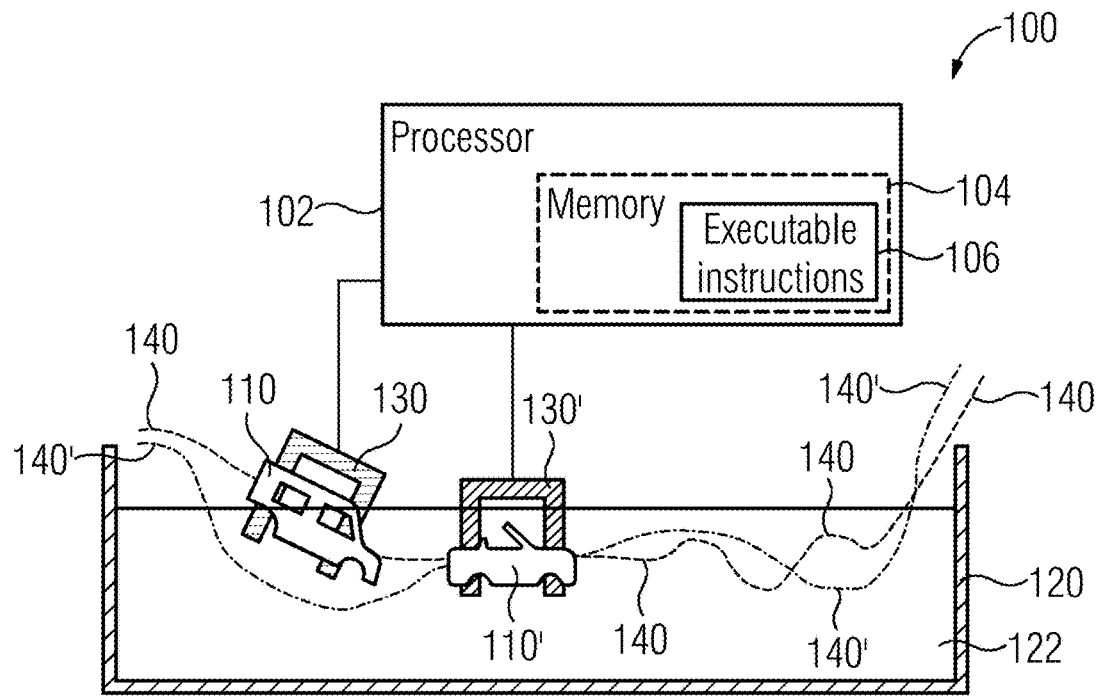
FIG. 2 illustrates a second exemplary system that facilitates coating a first body and a second body.

With reference to FIG. 2, a second exemplary system 100 is illustrated that facilitates coating a first body 110 and a second body 110'. The processor 102 may be configured similarly to the processor 102 of the first exemplary system 100, whereby the mentioned acts, such as determining a respective resulting coating layer, determining the first trajectory 140, and causing the at least one drive component 130 to move, are carried out for both the first body 110 and the second body 110' in order to determine a first trajectory 140 for the first body 110 and a first trajectory 140' for the second body 110'.

Additionally, the processor 102 may be configured to perform at least the mentioned acts, such as determining a resulting coating layer, determining the first trajectory 140, 140' and causing the at least one drive component 130 to move, such that at the first body 110 and the directly following second body 110' are seamlessly moved through the coating fluid 122 of the dipping bath 120 along their respective first trajectory 140, 140'. As mentioned above, this may be achieved by configuring the processor 102 to perform at least the acts of determining a respective resulting coating layer, determining the first trajectory 140, 140' and causing the at least one drive component 130 to move the respective body 110, 110' on-line and/or in real-time.

As suggested in FIG. 2, the first body 110 and the second body 110' may optionally be of a different kind, such as the first body 110 being the car body of an off-road vehicle and the second body 110' being the car body of a convertible.

Figure 3:
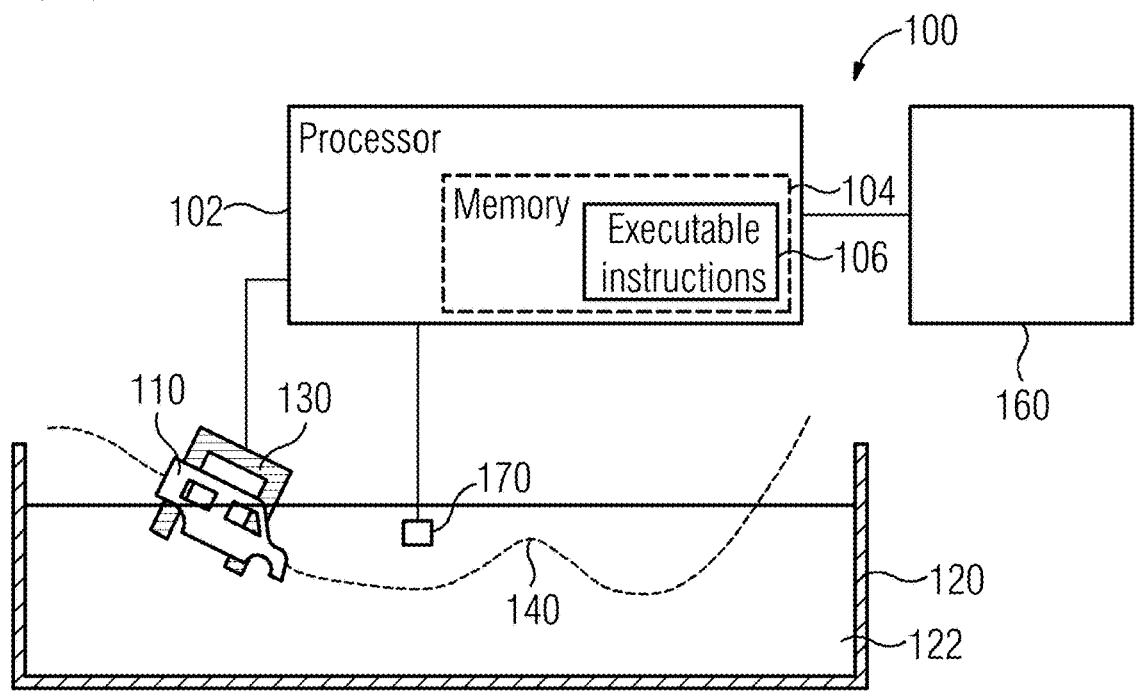
FIG. 3 illustrates a third exemplary system that facilitates coating a body.

With reference to FIG. 3, a third exemplary system 100 is illustrated that facilitates coating a body 110. The processor 102 may be configured similarly to the processor 102 of the first or second exemplary system 100. Additionally, the system 100 further includes a product lifecycle management (PLM) system, an engineering system, and/or a manufacturing operation management (MOM) system 160 and a sensor 170. The sensor 170 is configured to sense at least some of the characteristics of the body 110, the coating fluid 112, and/or the dipping bath 120.

Figure 4:
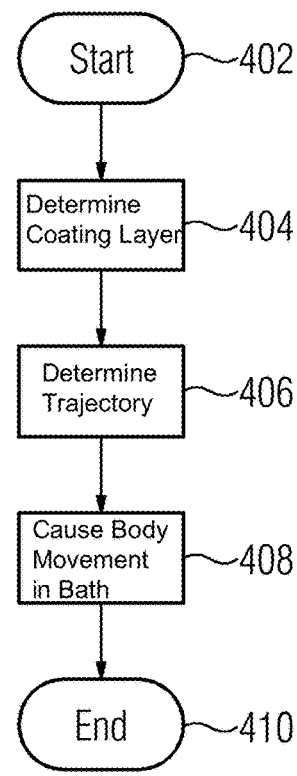
FIG. 4 illustrates a flow diagram of an example methodology that facilitates coating a body.

FIG. 4 illustrates a flow diagram of an example methodology that facilitates coating a body 110. The method may start at act 402 and the methodology may include several acts carried out through operation of at least one processor 102.

These acts may include an act 404 of determining a respective resulting coating layer based on simulating moving the respective body 110 at least partially through a coating fluid 122 of a dipping bath 120 along different trajectories; and an act 406 of determining a first trajectory 140 out of the different simulated trajectories fulfilling one or more pre-defined conditions; and an act 408 of causing at least one drive component 130 for moving the respective body 110 to move the respective body 110 at least partially through the coating fluid 112 of the dipping bath 120 along the first trajectory 140. At 410 the methodology may end.

It should be appreciated that the methodology 400 may include other acts and features discussed previously with respect to the suggested method and system.

By way of example, the one or more pre-defined conditions include at least one of minimum requirements of the resulting coating layer, a maximum deformation of the respective body, a maximum time duration, or any combination thereof.

Optionally, the first trajectory 140 may furthermore be determined such that the act of determining the first trajectory 140 takes into account moving the body 110 through the coating liquid 122 of the dipping bath 120 such that it results in no or negligible deformations of the body 110. By way of example, the methodology may further include the act of simulating the respective coating layer using the following input parameters: characteristics of the respective body 110, characteristics of the coating fluid 122, and characteristics of the dipping bath 120.

It should be appreciated that the methodology may further include performing at least the acts of determining a resulting coating layer, determining the first trajectory 140 and causing the at least one drive component 130 to move the respective body (110) on-line and/or in real-time.

In example embodiments, the methodology may further include the act of determining control instructions for the respective drive component 130 to control the respective drive component 130 such that the drive component 130 moves the respective body 110 at least partially through the coating fluid 122 of the dipping bath 120 along the first trajectory 140.

By way of example, the methodology may further include performing at least the acts of determining a respective resulting coating layer, determining the first trajectory 140 and causing the at least one drive component 130 to move the respective body 110 such that at a first body 110 and a directly following second body 110' are seamlessly moved through the coating fluid 122 of the dipping bath 120 along their respective first trajectory 140, 140'.

Figure 5:
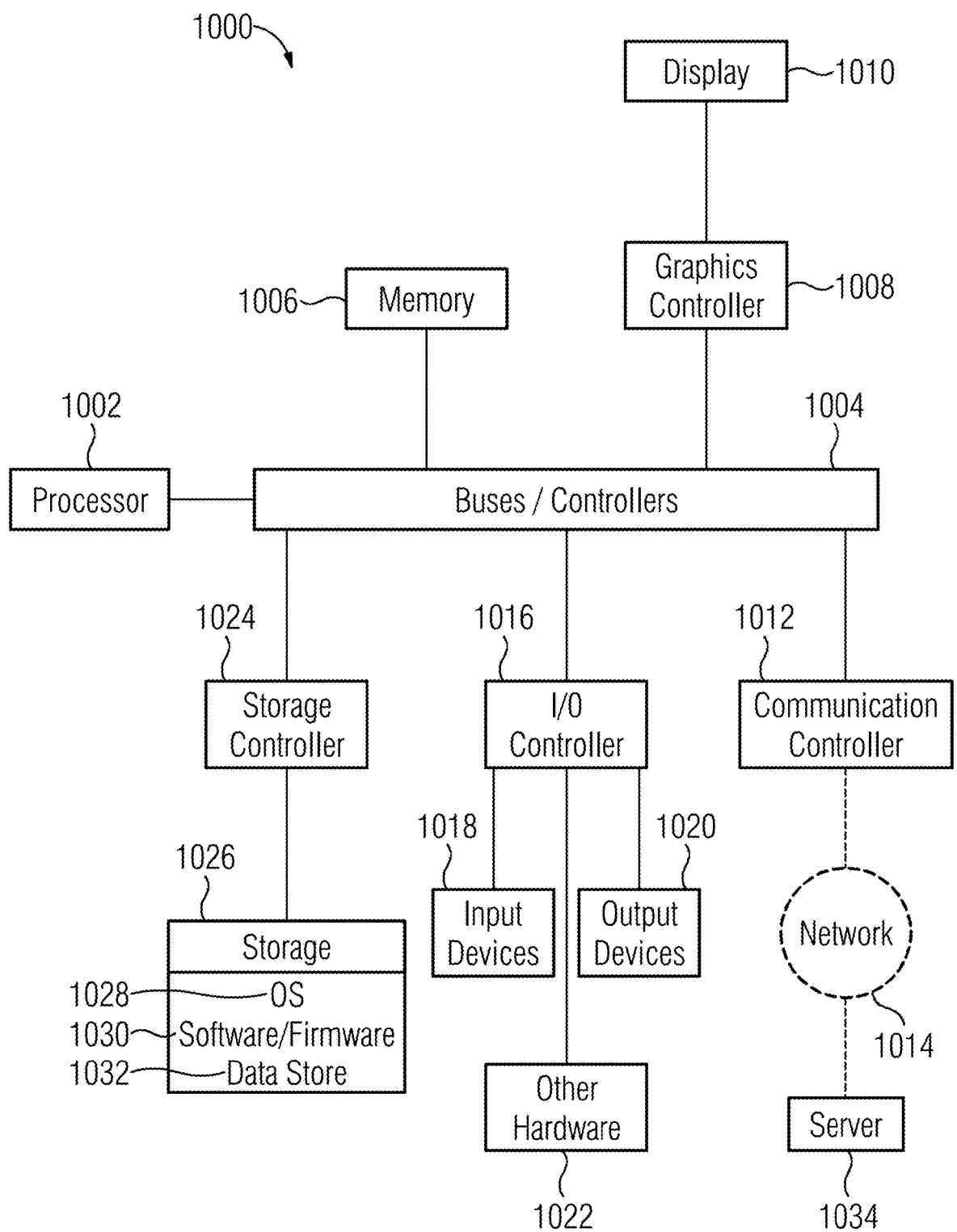
FIG. 5 illustrates a block diagram of a data processing system in which an embodiment can be implemented.

FIG. 5 illustrates a block diagram of a data processing system 1000 (also referred to as a computer system) in which an embodiment can be implemented, for example, as a portion of a product system, and/or other system operatively configured by software or otherwise to perform the processes as described herein. The data processing system depicted includes at least one processor 1002 (e.g., a CPU) that may be connected to one or more bridges/controllers/buses 1004 (e.g., a north bridge, a south bridge). One of the buses 1004, for example, may include one or more I/O buses such as a PCI Express bus. Also connected to various buses in the depicted example may include a main memory 1006 (RAM) and a graphics controller 1008. The graphics controller 1008 may be connected to one or more display devices 1010. It should also be noted that in some embodiments one or more controllers (e.g., graphics, south bridge) may be integrated with the CPU (on the same chip or die). Examples of CPU architectures include IA-32, x86-64, and ARM processor architectures.

Other peripherals connected to one or more buses may include communication controllers 1012 (Ethernet controllers, WiFi controllers, cellular controllers) operative to connect to a local area network (LAN), Wide Area Network (WAN), a cellular network, and/or other wired or wireless networks 1014 or communication equipment.

Further components connected to various busses may include one or more I/O controllers 1016 such as USB controllers, Bluetooth controllers, and/or dedicated audio controllers (connected to speakers and/or microphones). It should also be appreciated that various peripherals may be connected to the I/O controller(s) (via various ports and connections) including input devices 1018 (e.g., keyboard, mouse, pointer, touch screen, touch pad, drawing tablet, trackball, buttons, keypad, game controller, gamepad, camera, microphone, scanners, motion sensing devices that capture motion gestures), output devices 1020 (e.g., printers, speakers) or any other type of device that is operative to provide inputs to or receive outputs from the data processing system. Also, it should be appreciated that many devices referred to as input devices or output devices may both provide inputs and receive outputs of communications with the data processing system. For example, the processor 1002 may be integrated into a housing (such as a tablet) that includes a touch screen that serves as both an input and display device. Further, it should be appreciated that some input devices (such as a laptop) may include a plurality of different types of input devices (e.g., touch screen, touch pad, keyboard). Also, it should be appreciated that other peripheral hardware 1022 connected to the I/O controllers 1016 may include any type of device, machine, or component that is configured to communicate with a data processing system.

Additional components connected to various busses may include one or more storage controllers 1024 (e.g., SATA). A storage controller may be connected to a storage device 1026 such as one or more storage drives and/or any associated removable media, which can be any suitable non-transitory machine usable or machine-readable storage medium. Examples include nonvolatile devices, volatile devices, read only devices, writable devices, ROMs, EPROMs, magnetic tape storage, floppy disk drives, hard disk drives, solid-state drives (SSDs), flash memory, optical disk drives (CDs, DVDs, Blu-ray), and other known optical, electrical, or magnetic storage devices drives and/or computer media. Also in some examples, a storage device such as an SSD may be connected directly to an I/O bus 1004 such as a PCI Express bus.

A data processing system in accordance with an embodiment of the present disclosure may include an operating system 1028, software/firmware 1030, and data stores 1032 (that may be stored on a storage device 1026 and/or the memory 1006). Such an operating system may employ a command line interface (CLI) shell and/or a graphical user interface (GUI) shell. The GUI shell permits multiple display windows to be presented in the graphical user interface simultaneously, with each display window providing an interface to a different application or to a different instance of the same application. A cursor or pointer in the graphical user interface may be manipulated by a user through a pointing device such as a mouse or touch screen. The position of the cursor/pointer may be changed and/or an event, such as clicking a mouse button or touching a touch screen, may be generated to actuate a desired response. Examples of operating systems that may be used in a data processing system may include Microsoft Windows, Linux, UNIX, iOS, and Android operating systems. Also, examples of data stores include data files, data tables, relational database (e.g., Oracle, Microsoft SQL Server), database servers, or any other structure and/or device that is capable of storing data, which is retrievable by a processor.

The communication controllers 1012 may be connected to the network 1014 (not a part of data processing system 1000), which can be any public or private data processing system network or combination of networks, as known to those of skill in the art, including the Internet. Data processing system 1000 can communicate over the network 1014 with one or more other data processing systems such as a server 1034 (also not part of the data processing system 1000). However, an alternative data processing system may correspond to a plurality of data processing systems implemented as part of a distributed system in which processors associated with several data processing systems may be in communication by way of one or more network connections and may collectively perform tasks described as being performed by a single data processing system. Thus, it is to be understood that when referring to a data processing system, such a system may be implemented across several data processing systems organized in a distributed system in communication with each other via a network.

Further, the term "controller" is any device, system or part thereof that controls at least one operation, whether such a device is implemented in hardware, hardware with firmware, hardware with software, or some combination of at least two of the same. It should be noted that the functionality associated with any particular controller may be centralized or distributed, whether locally or remotely.

In addition, it should be appreciated that data processing systems may be implemented as virtual machines in a virtual machine architecture or cloud environment. For example, the processor 1002 and associated components may correspond to a virtual machine executing in a virtual machine environment of one or more servers. Examples of virtual machine architectures include VMware ESCi, Microsoft Hyper-V, Xen, and KVM.

Those of ordinary skill in the art will appreciate that the hardware depicted for the data processing system may vary for particular implementations. For example, the data processing system 1000 in this example may correspond to a computer, workstation, server, PC, notebook computer, tablet, mobile phone, and/or any other type of apparatus/system that is operative to process data and carry out functionality and features described herein associated with the operation of a data processing system, computer, processor, and/or a controller discussed herein. The depicted example is provided for explanation only and is not meant to imply architectural limitations with respect to the present disclosure.

Also, it should be noted that the processor described herein may be located in a server that is remote from the display and input devices described herein. In such an example, the described display device and input device may be included in a client device that communicates with the server (and/or a virtual machine executing on the server) through a wired or wireless network (which may include the Internet). In some embodiments, such a client device, for example, may execute a remote desktop application or may correspond to a portal device that carries out a remote desktop protocol with the server to send inputs from an input device to the server and receive visual information from the server to display through a display device. Examples of such remote desktop protocols include Teradici's PCoIP, Microsoft's RDP, and the RFB protocol. In such examples, the processor described herein may correspond to a virtual processor of a virtual machine executing in a physical processor of the server.

As used herein, the terms "component" and "system" are intended to encompass hardware with or without software.

Additionally, a component or system may be localized on a single device or distributed across several devices.

Also, as used herein a processor corresponds to any electronic device that is configured via hardware circuits, software, and/or firmware to process data. For example, processors described herein may correspond to one or more (or a combination) of a microprocessor, CPU, FPGA, ASIC, or any other integrated circuit (IC) or other type of circuit that is capable of processing data in a data processing system, which may have the form of a controller board, computer, server, mobile phone, and/or any other type of electronic device.

Those skilled in the art will recognize that, for simplicity and clarity, the full structure and operation of all data processing systems suitable for use with the present disclosure is not being depicted or described herein. Instead, only so much of a data processing system as is unique to the present disclosure or necessary for an understanding of the present disclosure is depicted and described. The remainder of the construction and operation of data processing system 1000 may conform to any of the various current implementations and practices known in the art.

Also, it should be understood that the words or phrases used herein should be construed broadly, unless expressly limited in some examples. For example, the term "include" as well as derivatives thereof, mean inclusion without limitation. The singular forms "a", "an" and "the" are intended to include the plural forms as well, unless the context clearly indicates otherwise. Further, the term "and/or" as used herein refers to and encompasses any and all possible combinations of one or more of the associated listed items. The term "or" is inclusive, meaning and/or, unless the context clearly indicates otherwise. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

Also, although the terms "first", "second", "third" and so forth may be used herein to describe various elements, functions, or acts, these elements, functions, or acts should not be limited by these terms. Rather these numeral adjectives are used to distinguish different elements, functions or acts from each other. For example, a first element, function, or act could be termed a second element, function, or act, and, similarly, a second element, function, or act could be termed a first element, function, or act, without departing from the scope of the present disclosure.

In addition, phrases such as "processor is configured to" carry out one or more functions or processes, may mean the processor is operatively configured to or operably configured to carry out the functions or processes via software, firmware, and/or wired circuits. For example, a processor that is configured to carry out a function/process may correspond to a processor that is executing the software/firmware, which is programmed to cause the processor to carry out the function/process and/or may correspond to a processor that has the software/firmware in a memory or storage device that is available to be executed by the processor to carry out the function/process. It should also be noted that a processor that is "configured to" carry out one or more functions or processes, may also correspond to a processor circuit particularly fabricated or "wired" to carry out the functions or processes (e.g., an ASIC or FPGA design). Further the phrase "at least one" before an element (e.g., a processor) that is configured to carry out more than one function may correspond to one or more elements (e.g., processors) that each carry out the functions and may also correspond to two or more of the elements (e.g., processors) that respectively carry out different ones of the one or more different functions.

In addition, the term "adjacent to" may mean: that an element is relatively near to but not in contact with a further element; or that the element is in contact with the further portion, unless the context clearly indicates otherwise.

Although an exemplary embodiment of the present disclosure has been described in detail, those skilled in the art will understand that various changes, substitutions, variations, and improvements disclosed herein may be made without departing from the spirit and scope of the disclosure in its broadest form.

The invention claimed is:

1. A method for coating at least a part of at least one body, the method comprising:
   determining, by a processor, a respective resulting coating layer based on simulation of moving a respective body at least partially through a coating fluid of a dipping bath along different trajectories;
   determining, by the processor, a first trajectory out of the different simulated trajectories fulfilling one or more pre-defined conditions; and
   causing at least one drive component for moving the respective body to move the respective body at least partially through the coating fluid of the dipping bath along the first trajectory.

2. The method according to claim 1, wherein the one or more pre-defined conditions include at least one of minimum requirements of the resulting coating layer, a maximum deformation of the respective body, a maximum time duration, or any combination thereof.

3. The method according to claim 1, further comprising:
   determining, by the processor, the respective coating layer using the following input parameters: characteristics of the respective body, characteristics of the coating fluid, and characteristics of the dipping bath.

4. The method according to claim 3, wherein the characteristics of the respective body comprise at least one of geometry, stiffness, dimensions, material, surface structure, temperature, electric potential, electric conductivity, or any combination thereof.

5. The method according to claim 3, wherein the characteristics of the coating fluid comprise at least one of material, density, temperature, viscosity, surface tension, electric potential, electric conductivity, or any combination thereof.

6. The method according to claim 3, wherein the characteristics of the dipping bath comprise at least one of geometry, dimensions, filling height of the coating fluid, information related to generated volumetric flow rate of the coating fluid, information related to heating or cooling, electric potential, electric power, or any combination thereof.

7. The method according to claim 3, wherein at least some of the characteristics of the respective body, the coating fluid and/or the dipping bath are provided to the processor using at least one of a product lifecycle management (PLM) system, an engineering system, a manufacturing operation management (MOM) system, at least one sensor for sensing at least some of the characteristics, or any combination thereof.

8. The method according to claim 1, further comprising:
   performing at least the acts of determining a respective resulting coating layer, determining the first trajectory, and causing the at least one drive component to move the respective body on-line and/or in real-time.

9. The method according to claim 1, wherein the first trajectory comprises at least one of position, velocity, acceleration, tilt angle, tilt angular velocity, tilt angular acceleration, or any combination thereof.

10. The method according to claim 1, further comprising:
determining control instructions for the at least one drive component to control the at least one drive component such that the at least one drive component moves the respective body at least partially through the coating fluid of the dipping bath along the first trajectory.

11. The method according to claim 1, further comprising:
performing at least the acts of determining a respective resulting coating layer, determining the first trajectory, and causing the at least one drive component to move the respective body such that the respective body and a directly following second body are moved through the coating fluid of the dipping bath along the first trajectory and a second trajectory, respectively.

* * * * *